United States Patent
Satoh et al.

(10) Patent No.: US 7,480,875 B2
(45) Date of Patent: Jan. 20, 2009

(54) METHOD OF DESIGNING A SEMICONDUCTOR INTEGRATED CIRCUIT

(75) Inventors: Kazuhiro Satoh, Neyagawa (JP); Kenji Shimazaki, Kobe (JP); Takahiro Ichinomiya, Katano (JP); Shouzou Hirano, Osaka (JP)

(73) Assignee: Panasonic Corporation, Osaka (JP)

( * ) Notice: Subject to any disclaimer, the term of this patent is extended or adjusted under 35 U.S.C. 154(b) by 447 days.

(21) Appl. No.: 11/312,370

(22) Filed: Dec. 21, 2005

(65) Prior Publication Data

US 2006/0143585 A1 Jun. 29, 2006

(30) Foreign Application Priority Data

Dec. 28, 2004 (JP) .................... P2004-380271

(51) Int. Cl.
*G06F 17/50* (2006.01)

(52) U.S. Cl. .............. 716/1; 716/2; 716/3; 716/4; 716/5; 716/6; 716/10

(58) Field of Classification Search ............. 716/1–6, 716/8–11, 17; 703/18–19
See application file for complete search history.

(56) References Cited

U.S. PATENT DOCUMENTS

| | | | |
|---|---|---|---|
| 5,444,288 A | 8/1995 | Jacobs | |
| 2002/0095647 A1 | 7/2002 | Bernstein et al. | |
| 2003/0057966 A1 | 3/2003 | Shimazaki et al. | |
| 2004/0031007 A1* | 2/2004 | Hirakimoto et al. | 716/8 |
| 2008/0052654 A1* | 2/2008 | Rahmat et al. | 716/6 |

FOREIGN PATENT DOCUMENTS

| | | |
|---|---|---|
| JP | 2000-277618 A | 10/2000 |
| JP | 2002-288253 | 10/2002 |
| JP | 2003-30273 | 1/2003 |

OTHER PUBLICATIONS

Japanese Office Action with English Translation issued in Japanese Patent No. 2004-380271, dated on Mar. 19, 2008.
Jingjing Fu, "A Fast Decoupling Capacitor Budgeting Algorithm for Robust On-Chip Power Delivery".

* cited by examiner

*Primary Examiner*—Paul Dinh
(74) *Attorney, Agent, or Firm*—McDermott Will & Emery LLP

(57) ABSTRACT

In optimizing a necessary capacitance of a semiconductor integrated circuit, the capacitance optimization can be achieved with higher precision by optimizing an IR drop (voltage drop) while considering dynamically a cell activation rate. In other words, in estimating a power-supply capacitance inserted to suppress a voltage fluctuation of the power supply, an areal demerit can be reduced by reducing a necessary capacitance component as a whole while considering a cell activation rate in the circuit or by selecting the capacitance required to supplement only temporal portions whose power-supply fluctuation is wide after the estimation of a cell operating timing. Also, the process can be conducted in a short time at the early stage of design by using a wiring load model at the time of capacitance estimate.

6 Claims, 16 Drawing Sheets

$Cd > 2 (C1+C2)$

METHOD OF DESIGNING A SEMICONDUCTOR INTEGRATED CIRCUIT

BACKGROUND OF THE INVENTION

1. Field of the Invention

The present invention relates to a method of designing a semiconductor integrated circuit and, more particularly, a method of designing a semiconductor integrated circuit capable of suppressing a power supply noise generated in a power supply wiring.

2. Description of the Related Art

In recent semiconductor integrated circuits, a fluctuation in potential of the power supply becomes very wide because circuit elements in excess of 10million transistors are incorporated. In order to suppress such fluctuation in the potential of power supply, it is employed as the normal technology to provide the capacitor that is called the decoupling capacitor provided between the power supply and the ground.

In the prior art, in JP-A-2000-277618, as the method of reducing the power supply noise, the method of calculating a capacitance value used to reduce the power supply noise every logic cell (every combinational logic circuit in which the transistors as the circuit elements of the semiconductor integrated circuit are combined to be contained within a uniform width) and then arranging a power-supply capacitor cell 12 with an appropriate capacitance value besides a logic cell (logic gate cell) 11 respectively, as shown in FIGS. 18(a) and (b), has been proposed. Here, 13, 14 denote a load capacitance of the logic gate cell 11 respectively, and 15 denotes a power-supply capacitance of the power-supply capacitor cell.

Also, in Non-Patent Literature 1, the method of executing the optimization based on the voltage drop information and the consumption current information derived from the placement/routing information of the semiconductor integrated circuit has been proposed.

However, the method set forth in JP-A-2000-277618 is not practical because it is impossible to sufficiently ensure a required capacitance (decoupling capacitance) within a limited chip area. Also, in some cases the unnecessary capacitor cell must be placed because the transistor acts as the capacitance in its inoperative status. In such case, sometimes the resultant placement is far from an ideal model.

Also, in the method set forth in Proceedings of ASP-DAC2004 pp. 505-6B-2: A Fast Decoupling Capacitor Budgeting Algorithm for Robust On-Chip Power Delivery, the appropriate placement of the decoupling capacitor cannot be realized because a capacitive effect of the inoperative transistor is not taken into consideration. Also, the layout must be designed previously, and thus the steps required until the layout is completed consume much time.

In this manner, as the approach of suppressing a dynamic voltage fluctuation such as the power supply noise, or the like, the approach of inserting the capacitor between the power supply and the ground, inserting the inductance into the power supply wiring or the ground wiring, or the like is employed. However, there exist the problems such that the approach of inserting the capacitor has the great areal demerit because the capacitor is formed uniformly in all cells, and also takes a much processing time because the power supply network must be dynamically analyzed in advance, and the like.

SUMMARY OF THE INVENTION

The present invention has been made in view of the above circumstances, and it is an object of the present invention to provide a method of designing a semiconductor integrated circuit that is capable of suppressing a power supply noise by optimizing a necessary total capacitance, while suppressing an increase of an occupied area.

In optimizing a necessary capacitance of a semiconductor integrated circuit, a method of designing a semiconductor integrated circuit of the present invention can achieve the capacitance optimization with higher precision by optimizing an IR drop (voltage drop) while considering dynamically a cell activation rate.

In other words, a method of designing a semiconductor integrated circuit, includes a step of calculating a necessary total capacitance required to optimize a voltage drop from circuit information, while considering whether or not respective cells in an object circuit are in an active status.

The present invention has been made in view of the fact such that the cells such as the inoperative transistor, and the like act as a capacitance. According to this method, a static or dynamic fluctuation of the power supply can be stabilized by executing the optimization of the power supply capacitance while considering a capacitive effect of the inoperative transistor.

Also, in the method of designing the semiconductor integrated circuit of the present invention, the circuit information are net list information, and the method further includes a step of reading the net list information of the object circuit; a step of reading a cell activation rate in the net list information; and a step of calculating the necessary total capacitance required to optimize the voltage drop, based on the cell activation rate of the object circuit.

According to this method, since the influence of the inoperative transistor as the capacitor is considered while using the activation rate as a parameter, the capacitance can be placed in an appropriate block by an appropriate amount based on the net list without a floor plan. Therefore, in estimating a power-supply capacitance inserted to suppress a voltage fluctuation of the power supply, an areal demerit can be reduced by reducing a necessary capacitance component as a whole while considering a cell activation rate in the circuit or by selecting the capacitance required to supplement only temporal portions whose power-supply fluctuation is wide after the estimation of a cell operating timing. Also, the process can be conducted in a short time at the early stage of design by using a wiring load model at the time of capacitance estimate.

Also, the method of designing the semiconductor integrated circuit of the present invention further includes a step of reading unit capacitor cell information in the net list information from the net list information; and a step of deciding a capacitor cell-displacement position, based on the unit capacitor cell information and the cell activation rate.

Also, the method of designing the semiconductor integrated circuit of the present invention further includes a step of extracting a capacitance of a ready-placed capacitor cell obtained in the step of reading the unit capacitor cell information and a capacitance in a cell acting as a capacitance component at an activation rate 0; wherein the step of deciding the capacitor cell displacement position decides to take account of a capacitance component of the ready-placed capacitor cell.

Also, the method of designing the semiconductor integrated circuit of the present invention further includes a step of generating a load model from the net list information in the circuit information, and then calculating a cell operating time based on the load model; a step of calculating each cell power consumption based on the load model; and a step of calculating dynamic power consumption information based on the cell operating time and the cell power consumption; wherein the step of calculating the necessary total capacitance includes a step of converting the dynamic power consumption information into dynamic current information, and a step of calculating a capacitance value required to restrain the dynamic current within the maximum allowable current value.

Also, in the method of designing the semiconductor integrated circuit of the present invention, layout information is generated from the net list information, and then the load model is generated based on load information obtained from the layout information.

Also, the influence of the inoperative transistor as the capacitance can be considered while using the activation rate as a parameter after the layout information is generated from the net list information or the floor plan is further formed. Therefore, the capacitance can be placed in the appropriate position with better precision.

Also, in the method of designing a semiconductor integrated circuit of the present invention, the step of calculating dynamic power consumption information is a step of calculating the dynamic power consumption information based on the cell operating time and the cell power consumption and the cell activation rate.

According to this method, the dynamic power consumption is calculated from the cell operating time and the cell power consumption and the cell activation rate. Therefore, it is feasible to calculate the capacitance with higher precision. Thus, the optimization of the power supply capacitance can be realized effectively and with high precision.

Also, the method of designing the semiconductor integrated circuit of the present invention further includes a step of calculating a cell operating time of each cell of the object circuit; and a step of calculating an in-cell capacitance when the cell is not operated; wherein a power supply capacitance is inserted after an in-cell capacitance component of the nonconcurrently operating cell is subtracted.

According to this method, the capacitance is inserted after an in-cell capacitance component of the nonconcurrently operating cell is subtracted. Therefore, unnecessary capacitor insertion can be avoided, and also the optimization of the capacitance can be realized with high precision and high reliability.

Also, the method of designing the semiconductor integrated circuit of the present invention further includes a step of executing a voltage drop analysis of the object circuit; a step of allotting a weight to power-supply capacitor insertable locations based on voltage drop values; and a step of inserting a power-supply capacitance in order of weight.

According to this method, the weighting is executed based on not the limit value used to suppress the peak of the current waveform but the total capacitance. Therefore, this method can respond to the case where an area of the circuit is restricted.

Also, the method of designing the semiconductor integrated circuit of the present invention further includes a step of executing a timing calculation while considering the voltage drop values obtained in the step of executing the voltage drop analysis; and a step of executing a weighting of the power-supply capacitor insertable locations, based on the voltage drop values and a result obtained in the step of executing the timing calculation.

According to this method, the influence of the inoperative transistor as the capacitor is considered while using the activation rate as a parameter, and also the weight is allotted to the locations that are severe in timing. Therefore, the capacitance can be placed particularly in appropriate positions.

Also, the method of designing the semiconductor integrated circuit of the present invention further includes a step of reading a cell activation rate from the circuit information; wherein the step of executing the weighting is a step of allotting the weight to power-supply capacitor insertable locations, based on the voltage drop values and the cell activation rate.

Also, the method of designing the semiconductor integrated circuit of the present invention further includes a step of calculating a cell operating time of each cell of the object circuit; a step of extracting a neighboring simultaneously operating cell of the object circuit; and a step of extracting a location near which the extracted cell is placed; wherein the step of inserting the power-supply capacitor inserts the power-supply capacitance preferentially into the extracted cell.

Also, the method of designing the semiconductor integrated circuit of the present invention further includes a step of reading the activation rate; and a step of controlling the cell whose activation rate is high and whose power consumption is large such that the cell is placed near a power supply pad in a floor plan.

According to this method, the cell having the high activation rate and the cell having the large power consumption are placed close to the input portion of the power supply. Therefore, the capacitance can be placed particularly in appropriate positions.

Also, the method of designing the semiconductor integrated circuit of the present invention further includes a step of calculating a necessary total capacitance every cell; and a step of relocating a ready-placed cell to the capacitor insertable locations.

According to this method, since the ready-placed cells are relocated to the location where the capacitance is to be inserted, the appropriate capacitance placement can be attained without an increase of an occupied area.

Also, since the space is prepared previously, the capacitance can be easily placed in the appropriate positions.

Also, since the capacitance is placed in the locations that have the high activation rate, the power supply capacitance can be frequently used effectively.

Also, since the location where the activation rate is high and the location where the activation rate is low are mixed, the neighboring cell can be easily utilized effectively when the displacement of the capacitor cell is difficult.

Also, since the concurrent switching is taken into consideration, the capacitor can be placed in the locations where the influence of such switching is strong.

Also, the method of designing the semiconductor integrated circuit of the present invention further includes a step of reducing the necessary total capacitance by relocating the nonconcurrently operating cell or the inactive cell to the capacitor insertable locations prior to capacitor insertion.

According to this method, the optimization of the capacitance can be attained easily not to increase an occupied area.

Also, according to the method of designing the semiconductor integrated circuit of the present invention, the optimization of the power supply capacitance is carried out while considering the capacitive effect of the transistor in its inactive status. Therefore, the static or dynamic fluctuation of the power supply can be stabilized.

Also, since the influence of the inoperative transistor as the capacitance is taken into consideration while using the activation rate as a parameter, based on the net list or layout information, such influence of the inoperative transistor as the capacitance can be considered while using the activation rate as a parameter without the floor plan or after the floor plan is carried through. Therefore, the capacitance can be placed in the appropriate position with good precision.

DESCRIPTION OF THE PREFERRED EMBODIMENTS

Embodiment 1

A method of designing a semiconductor integrated circuit device of the present embodiment is characterized in that the step of deciding capacitor cell positions by calculating a necessary total capacitance required to optimize a voltage drop, while taking account of a cell activation rate and a cell operating time in the net list information is contained.

Figure 1:
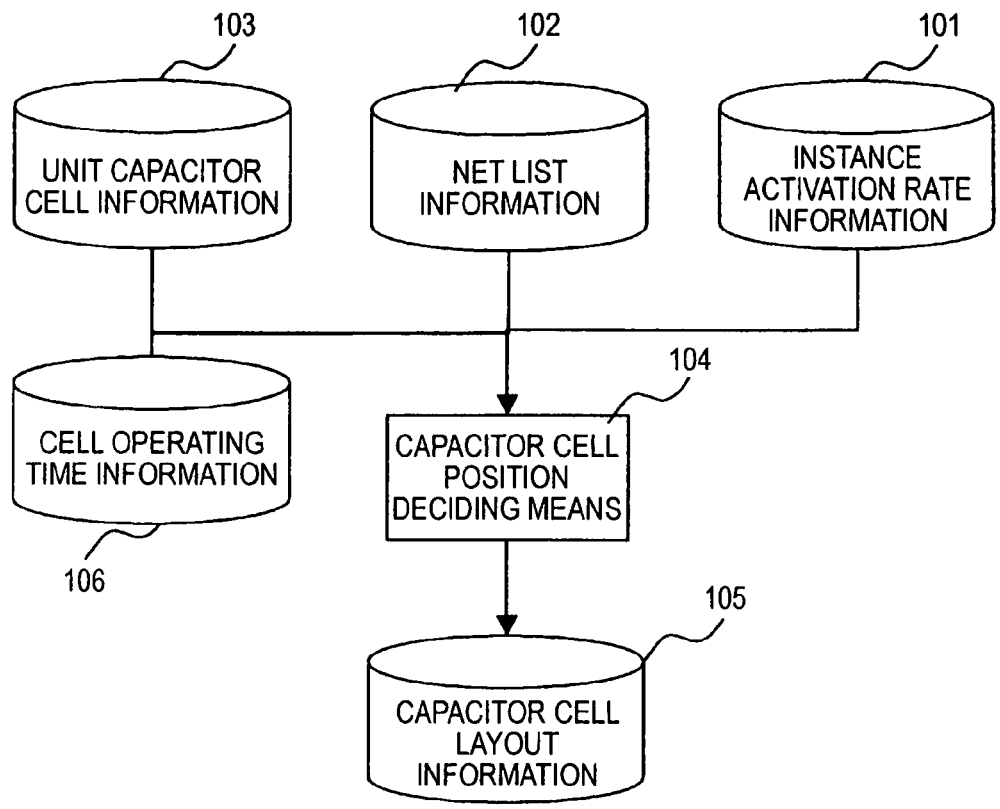
FIG. 1 is a block diagram using a cell activation rate according to Embodiment 1 of the present invention.

FIG. 1 is a block diagram showing a configuration of a design system that executes the method of designing the semiconductor integrated circuit according to Embodiment 1 of the present invention. The design system shown in FIG. 1 includes a capacitor cell position deciding means 304 that calculates a necessary total capacitance required to optimize the voltage drop, then decides capacitor cell positions, and then outputs capacitor cell layout information 305. In this design system, unit capacitor cell information 303, net list information 302, instance activation rate information 301, and cell operating time information 106, if necessary, are input into the capacitor cell position deciding means 304.

This design system is operated in brief as follows.

The net list information 302 means the data that represent a circuit network of the semiconductor integrated circuit serving as an object of design (referred to as an "object circuit of design" hereinafter). In this embodiment, the circuit network in which logic cells are coupled by the wirings is employed. Such logic cell is constructed by arranging logic gates having the logic such as logical NOT, logical sum, or logical product to have uniform heights or widths. Since a plurality of logic cells having the same logic are employed on the same net list, individual logic cells are normally called the "instance" to discriminate them mutually.

The unit capacitor cell information 303 means the data that represent a size and a capacitance value of a decoupling capacitor cell that can provide a capacitance between the power supply and the ground. This cell is realized by a device capacitor that utilizes a capacitance of a gate oxide film between the gate terminal and the coupled source and drain terminals of the transistor cell, or the like, for example.

In the case of a parameterized cell that can vary a size of the capacitor cell in response to the required capacitance value the data representing a relationship between a size and a capacitance value of the cell are stored.

The instance activation rate information 301 represents an activation rate as an operating frequency of each instance constituting an individual logic cell. This activation rate expresses the operating frequency by the rate that indicates how many times the output of the instance is varied within predetermined clock periods, for example. It is preferable that, if the circuit network is represented by a distribution of the operating frequency in the clock period, the cell placement that makes it possible to stabilize much more the fluctuation of the power supply can be achieved, as shown in the embodiment described later.

The capacitor cell position deciding means 304 estimates the fluctuation of the voltage in individual instance based on the net list information 302. At this time, the estimate is made based on the instance activation rate information 301, while considering the influence of the capacitance of the inoperative instance under the assumption that such capacitance of the inoperative instance acts to suppress a fluctuation of the voltage, like the decoupling capacitor. As a result, the capacitance necessary for individual instance can be estimated from a relationship between a voltage drop and a consumption current, then the number or the size of required capacitors can be decided based on the unit capacitor cell information 303, and then the result of placement of the capacitor cells as well as the logic cells can be output as the capacitor cell layout information 305.

The cell operating time information 106 means the information that represent at what point of time the instance in the net list should operate or should have a possibility to operate with respect to a reference time. For example, such information are contained in a VCD (Value Change Dump) file including operation information High/Low and transition time information of each net derived by using the logic verification tool, or the like, and a delay information file as for each clock signal derived by the static timing analysis (STA) tool.

In the semiconductor integrated circuit obtained in this manner, the local voltage drop can be suppressed rather than the case where the capacitor cell is placed in empty areas after the logic cells are placed.

Details of the design system will be explained hereunder.

Figure 2:
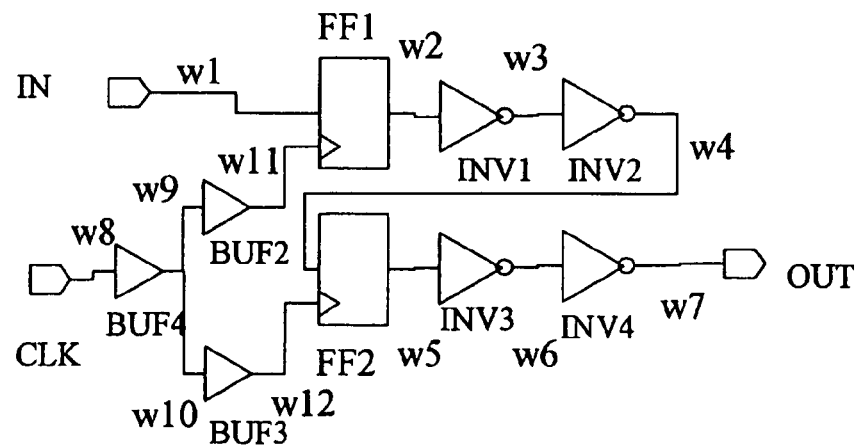
FIG. 2 is a view explaining a wiring activation rate according to Embodiment 1 of the present invention.

The net list information 302 means the data that represent the circuit network of the object circuit of design. For example, an object circuit of design shown in FIG. 2 is stored. In this example, the object circuit is constructed by clock buffers CK1, CK2, CK3, flip-flops FF1, FF2, inverters INV1, INV2, INV3, INV4, and wirings for connecting these elements. Also, technological information of the power-supply wirings (resistance density of the power-supply wirings, dielectric constant of the material located between the wirings, etc.), consumption currents consumed by the logic cells when the logic is changed, capacitance values between the power supply of the logic cells and the ground when the logic is not changed, capacitance values of respective wirings, and change times (transition times) when respective instances are changed are contained.

The unit capacitor cell information 303 means the data that represent a size and a capacitance value of the decoupling cell that is formed to constitute the capacitance between the power supply and the ground. For example, the information such that capacitor cells CAP1, CAP2, CAP3 have a capacitance value 1 pF, 5 pF, 10 pF and a cell width of 10 μm, 40 μm, 80 μm respectively are stored.

The instance activation rate information 301 represents the activation rate as the operating frequency of the instance constituting individual logic cell. As shown in FIG. 2, the operating frequency is represented by the rate that indicates how many times the output of the instance is varied within predetermined clock periods in such a manner that, for example, signal lines w8, w9, w10, w11, w12, show 200% because these lines are synchronized with a clock, a signal line w1 shows 50% if this line is changed once every two clock periods, signal lines w2, w3, w4, w5, w6, w7 also show 50% if the signal is propagated from input terminals of FF1, FF2 to output terminals respectively every time when the clock is changed, and the like. Such information can be checked previously by using the logic simulator.

Figure 3:
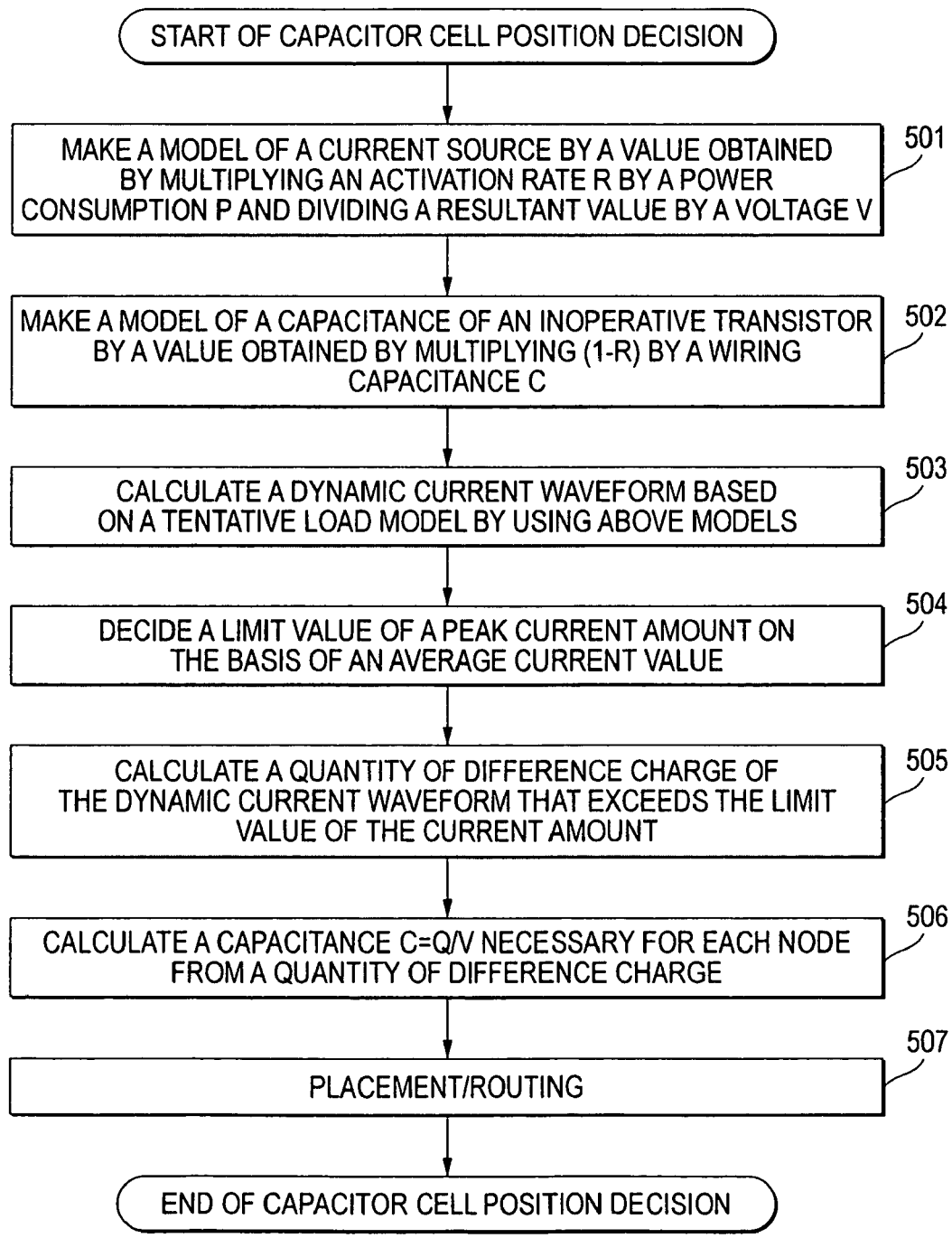
FIG. 3 is a flowchart estimating a necessary capacitance before a floor plan in Embodiment 1 of the present invention.

The capacitor cell position deciding means 304 decides cell positions in compliance with a flowchart in FIG. 3.

First the condition before a floor plan, in which actual placement and routing are not carried out, is assumed herein. Therefore, in calculating a current waveform, an operating time of the instance and the power consumption every instance can be estimated based on a load capacitance model (tentative load model), which is normally used widely and is represented by a relationship between a rough circuit scale, a placement area, and a fan out (the number of input pins to the output terminal). Accordingly, a global power consumption and a necessary capacity of the power supply can be calculated before the actual processes of the floor plan are started, and thus a capacitor cell area required until the stage of the floor plan can be assured.

Next, a fluctuation of the voltage in individual instance is estimated by using the net list information 302 shown in FIG. 2. At this time, a power consumption P is calculated by reading a magnitude of the power consumption in individual instance in each change of the output at the same time and integrating the instance activation rate information. Because P=IV, a current amount I of a current source can be calculated by dividing the power consumption P by a power supply voltage V. A waveform of the current source is built up by using a previously decided changing time of the instance such that an integrated value becomes equal to the current amount I (step 501).

Then, a value obtained by multiplying (1-the activation rate R) by a total capacitance C, that inoperative transistors provide in their inoperative state as a capacitance component, is calculated as a capacitance component that the inoperative transistors provide as the decoupling capacitance (step 502). Here, as the capacitance component that respective instances provide in their inoperative state as the capacitance component, internal capacitances of the transistors and the cells, which are located between the power supply and the ground when the output signal of the cell is fixed to a High or Low state, and load capacitances of the output wirings may be considered. It may be considered that, since the internal capacitances of the transistors and the cells are the values peculiar to not the instances but the cells, such internal capacitances can be added to library information as the internal capacitance of the cell in the output-fixed state when the characterizing process is applied to prepare commonly the operating characteristics of the cells (the delay characteristic and the power consumption characteristic) as the library.

Also, since the load capacitances of the output wirings are different every instance, it is difficult to execute a high-speed processing by preparing them as the library. However, it is possible to calculate an effective capacitance rate when the load capacitance of the output wiring acts as the power-supply capacitance every cell. Therefore, if it is characterized previously to what extent each load capacitance out of the overall load capacitances of the wirings can act as an effective inter-power supply capacitance, such effective capacitance rate can be calculated by multiplying the load capacitance of the output wiring by its coefficient.

Figure 4:
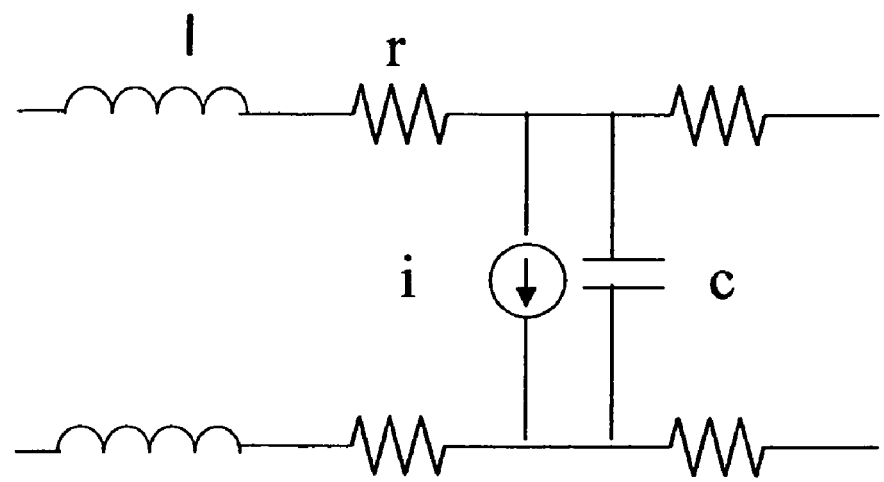
FIG. 4 is a diagram of a power supply route model in calculating the necessary capacitance in Embodiment 1 of the present invention.

Then, a waveform of the current source is given to i of a power supply route model shown in FIG. 4, and the capacitance component acting as the decoupling capacitance of the inoperative transistor, the ready-placed capacitor cell, and the inter-power supply wiring capacitance are given to c of the same. A previously decided constant resistance value is given to a power supply resistance r. Also, if inductance components in a power supply pad and an LSI are included in a portion I, such inductance components can be considered. In this circuit network, a dynamic current variation and a voltage fluctuation at each contact are calculated by using the transistor level simulator such as SPICE (Simulation Program with Integrated Circuit Emphasis), or the like (step 503).

Then, a limit value limit of a peak current (a highest portion out of a crest value of the current waveform) is decided on the basis of an average current value. For example, if this value is set previously to 1.2 times of the average current value, such value is calculated (step 504).

Figure 5:
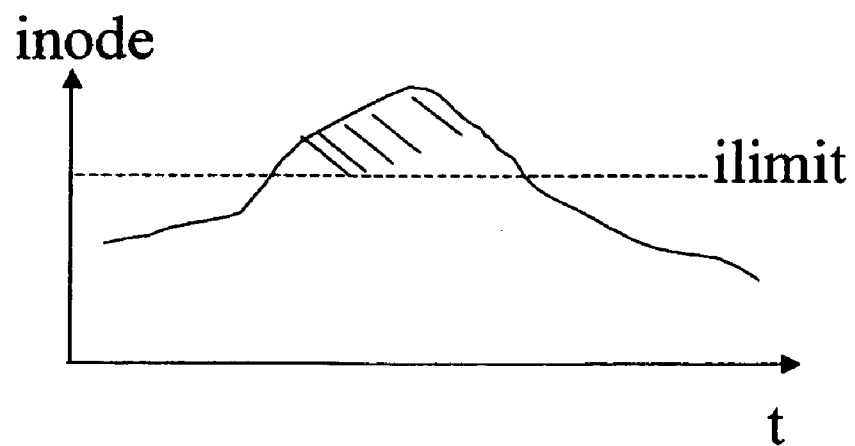
FIG. 5 is a view of a current waveform model in calculating the necessary capacitance in Embodiment 1 of the present invention.

Then, as shown in FIG. 5, a difference area of the dynamic current waveform that exceeds the limit value of the peak current amount is calculated as a quantity of difference charge Q (step 505).

Then, a capacitance C=Q/V necessary for each node is calculated from the quantity of difference charge Q (step 506).

Then, finally respective instances and the capacitances necessary for respective nodes are placed by using the placing tool. The placing tool can be easily realized by using the tool that is normally called the P&R tool (step 507). If the current waveform shown in FIG. 5 is formed in finer unit, e.g., is not calculated over the whole LSI but every functional module, such current waveform can be estimated with higher precision.

Embodiment 2

In this event, a global placement (floor plan) may be prepared before the cells containing the capacitance are optimally placed in advance by the capacitor cell position deciding means 304. A block diagram of a system configuration and a flowchart of this method are shown in FIG. 6 and FIG. 7 respectively.

Figure 7:
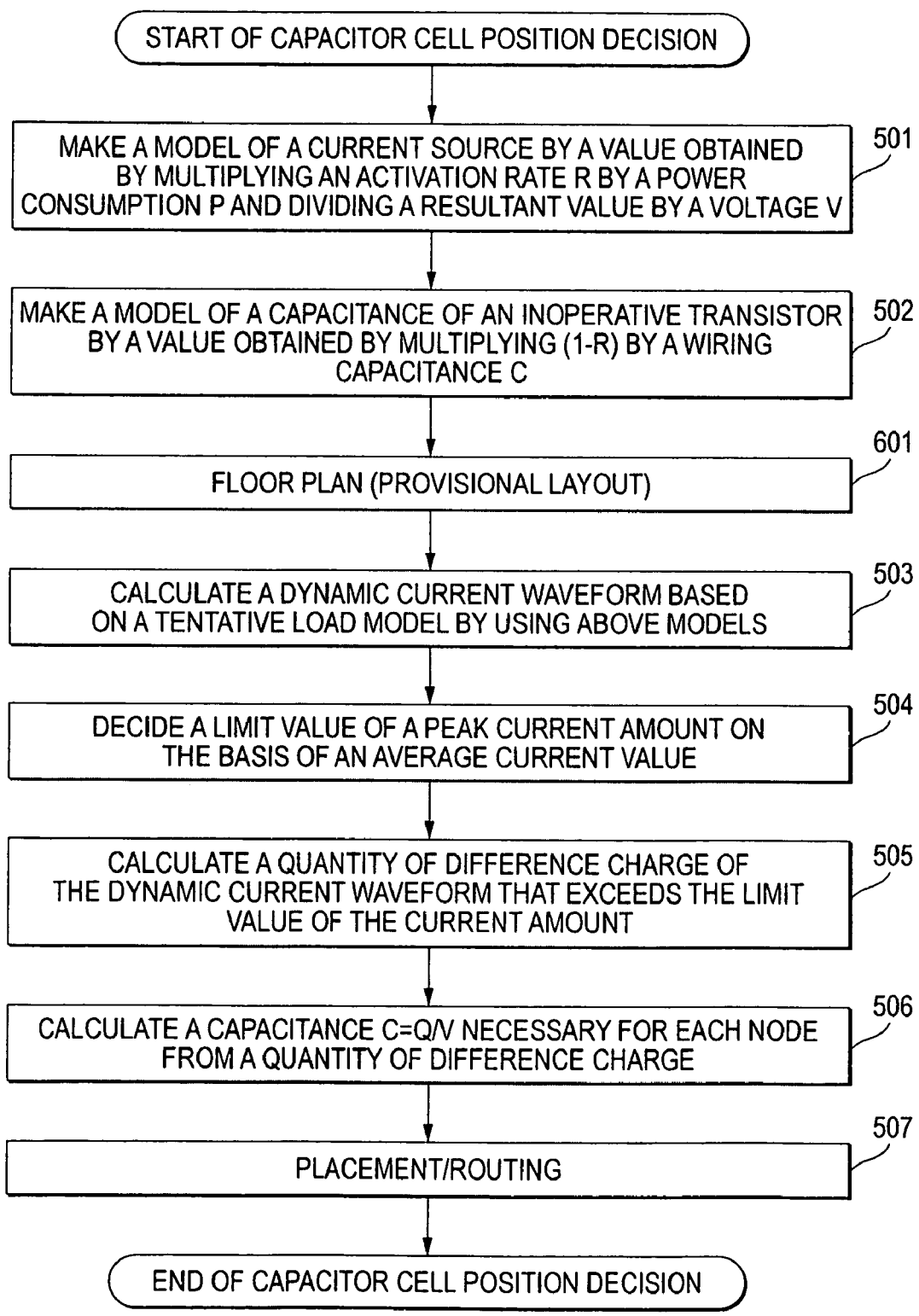
FIG. 7 is a flowchart estimating a necessary capacitance in a floor plan in Embodiment 2 of the present invention.

Here, the floor plan in step 601 in FIG. 7 is added. In this configuration, placement positions of memory cells and soft micro cells are decided and the power supply routings are provided, and at least the global placement of the logic cells are provided. Here, processes of the detailed routings of the signal wirings, and the like are not required. If this approach is employed, placement positions of blocks are decided in the whole LSI though roughly, and therefore a precision of the distribution of the power consumption can be improved. Also, the influence of the capacitive effect of the power supply resistance and the inoperative cell can be estimated more precisely, so that the high-precision estimate can be carried out by the processes up to the global placement in a short time of the processing time.

Figure 6:
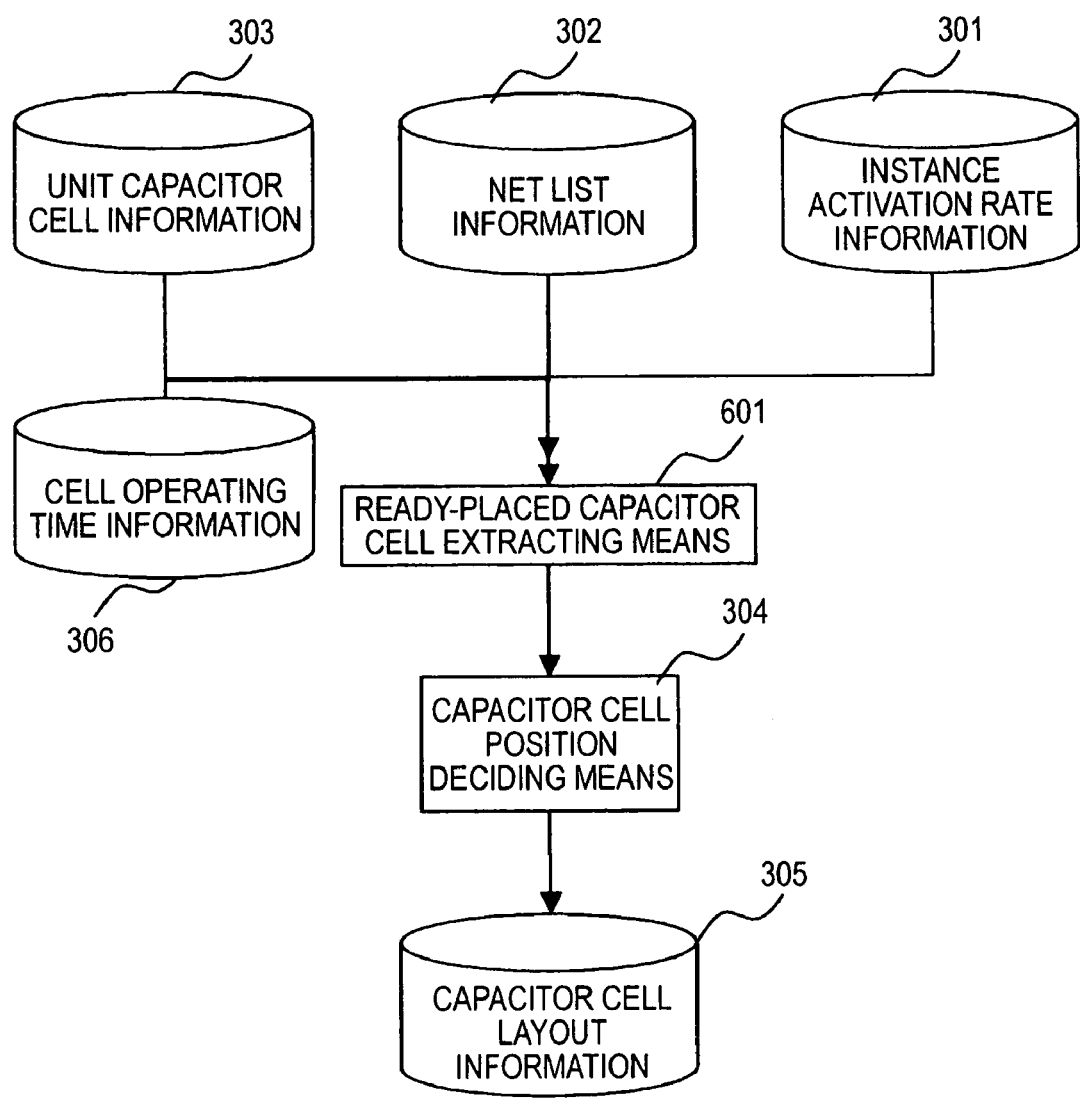
FIG. 6 is a block diagram considering an existing capacitance according to Embodiment 2 of the present invention.

Also, in FIG. 6, the capacitive effect of the ready-placed capacitor cell and the inoperative cell is estimated by a ready-placed capacitor cell extracting means 404. A reduction of noise can be attained based on this information by fewer capacitor cells.

Embodiment 3

Figure 8:
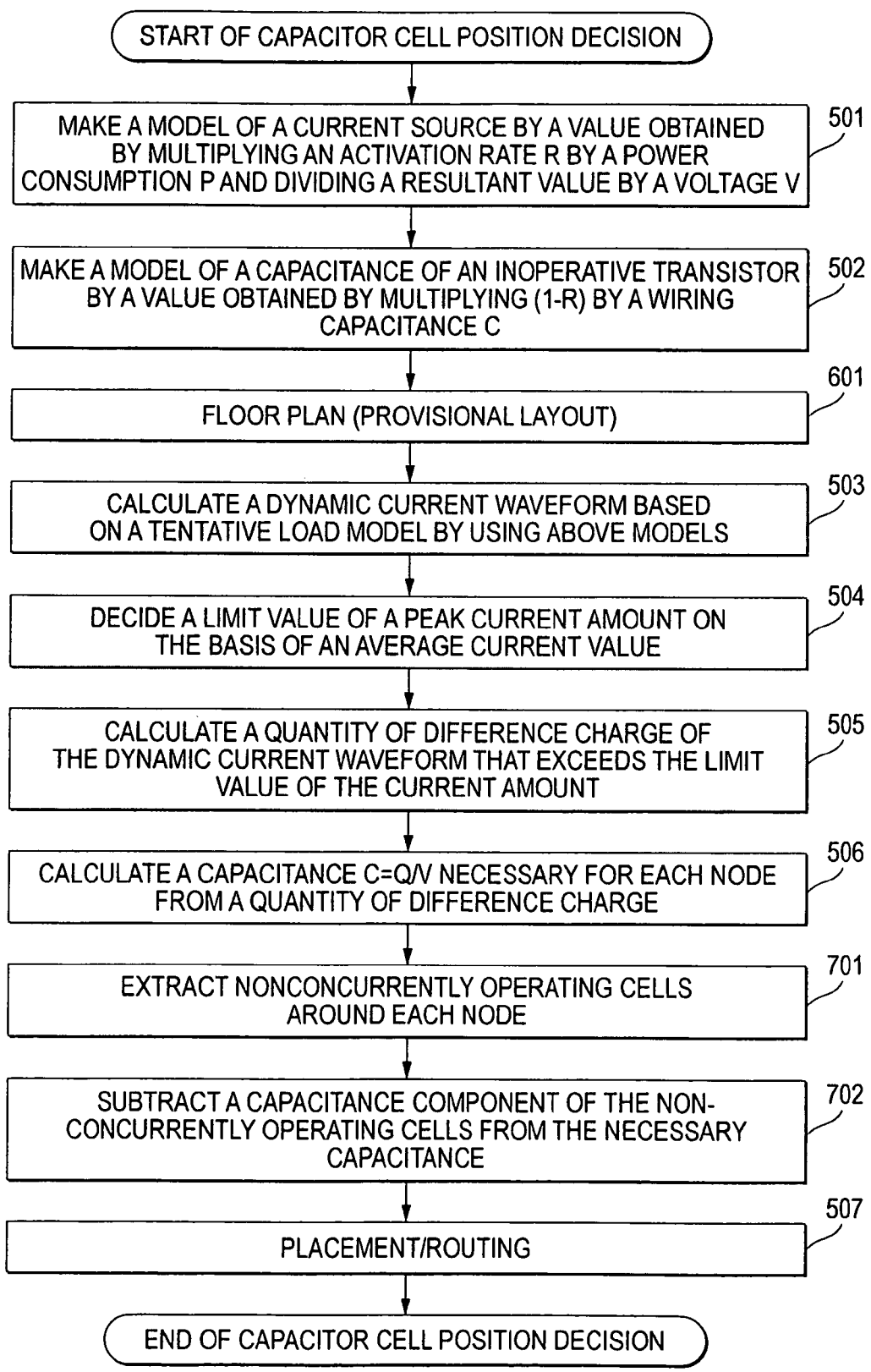
FIG. 8 is a flowchart considering a nonconcurrently operating cell capacitance according to Embodiment 3 of the present invention.

Also, as shown in a flowchart of FIG. 8, Embodiment 3 of the present invention is characterized in that step 701 in which the capacitor cell position deciding means extracts the nonconcurrently operating cells around each node, and step 702 in which the capacitance component of the nonconcurrently operating cells is subtracted from the necessary capacitance are provided.

In this step 701, the cells located around each node, which are not operated concurrently or not operated within a several ps to several ns time before or after the concurrence, are extracted as the nonconcurrently operating cells. The information required to extract the nonconcurrently operating cells can be extracted from the file containing the cell (net) operating time such as the VCD (Value Change Dump) file output from the normal logic verification tool, or the like, or each instance operating time information with respect to the clock operation such as the static timing analysis (STA) tool, or the like.

Also, since the step 702 of subtracting the capacitance value of the nonconcurrently operating cells from the capacitance value calculated as necessary capacitance for each node is added, the capacitance acting as the capacitance component during the actual operation of the LSI except the capacitor cell and the inter-wiring capacitance can be taken into consideration. Thus, only the capacitance that is truly needed can be added.

This fact can achieve such effects that the capacitances can be placed in the appropriate positions, the number of the power-supply capacitance can be reduced by considering the capacitance of the nonconcurrently operating cells, and an increase of the area required to insert the capacitor cell can be suppressed.

Embodiment 4

Figure 9:
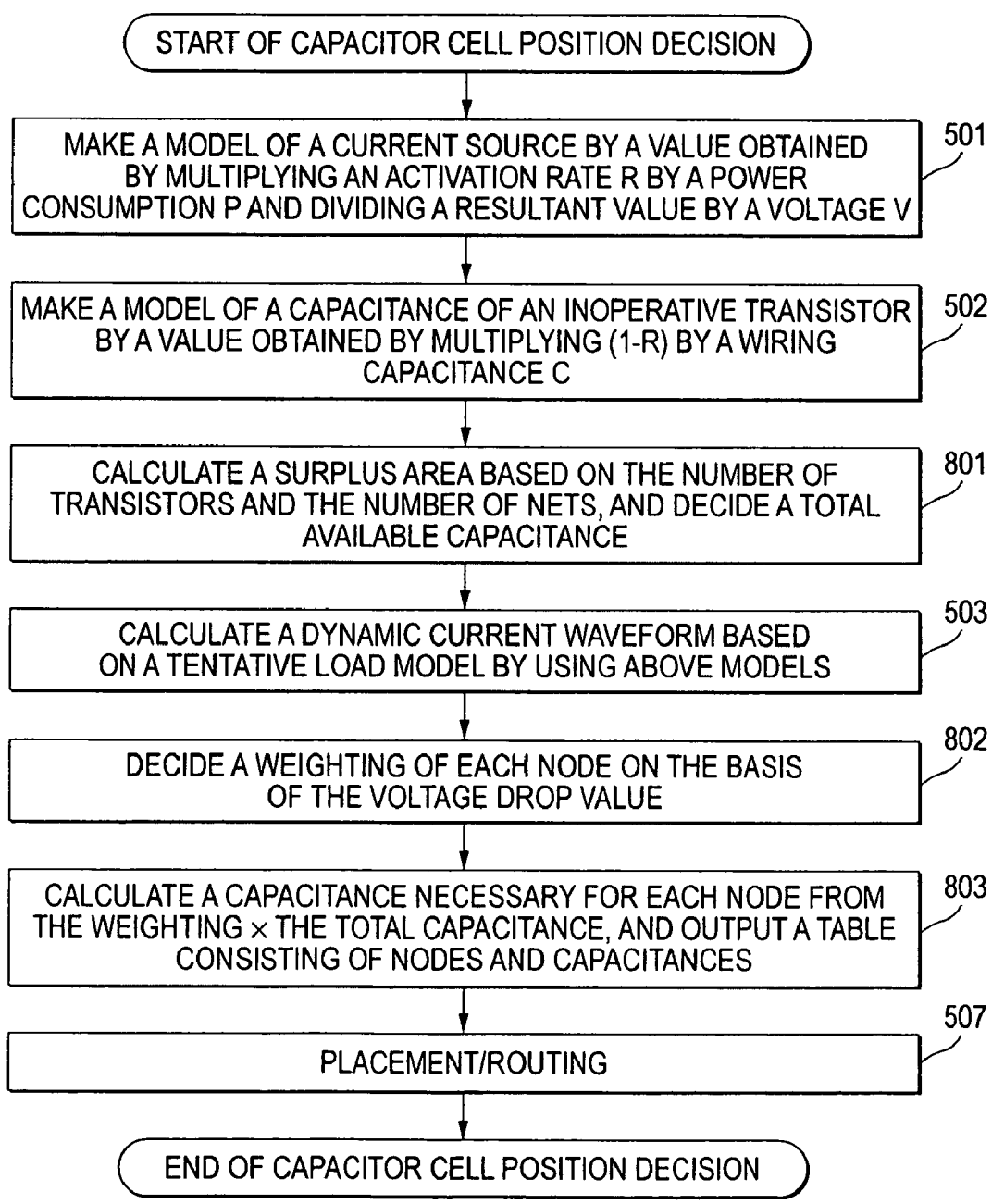
FIG. 9 is a flowchart inserting a limited area capacitance according to Embodiment 4 of the present invention.

Also, as shown in a flowchart of FIG. 9, Embodiment 4 of the present invention is characterized in that the capacitor cell position deciding means contains a step 801 in which a model of the capacitance of the inoperative transistor is made by the value obtained by multiplying the activation rate by the wiring capacitance, then a surplus area is calculated based on the number of transistors and the number of nets, and then a total available capacitance is decided, a step 802 in which a voltage drop value of each node and a dynamic current waveform are calculated, and then a weighting of each node is decided on the basis of the voltage drop value, and a step 803 in which a capacitance necessary for each node is calculated, and then a table consisting of nodes and capacitances is output.

In other words, in step 801, the surplus area is calculated based on the number of transistors and the number of nets, and then a total insertable capacitance is decided based on the information of the area and the capacitance value necessary for the construction of the major capacitor cells. Then, in step 503, the voltage drop value of each node and the dynamic current waveform are calculated and, in step 802, the weighting of each node is decided on the basis of the voltage drop value such that the power-supply capacitance is inserted preferentially into the node having the large voltage drop value. Then, in step 803, the capacitance necessary for each node is calculated from the weighting×the total capacitance, and then the table consisting of nodes and capacitances is output. Thus, all the necessary capacitances decided from the limit value to suppress a peak current waveform are not inserted, but the capacitance can be inserted into the effective position by weighting the total insertable capacitance. This makes it possible to insert the limited capacitances such that they can be used effectively to their maximum when the area is restricted.

Embodiment 5

Figure 10:
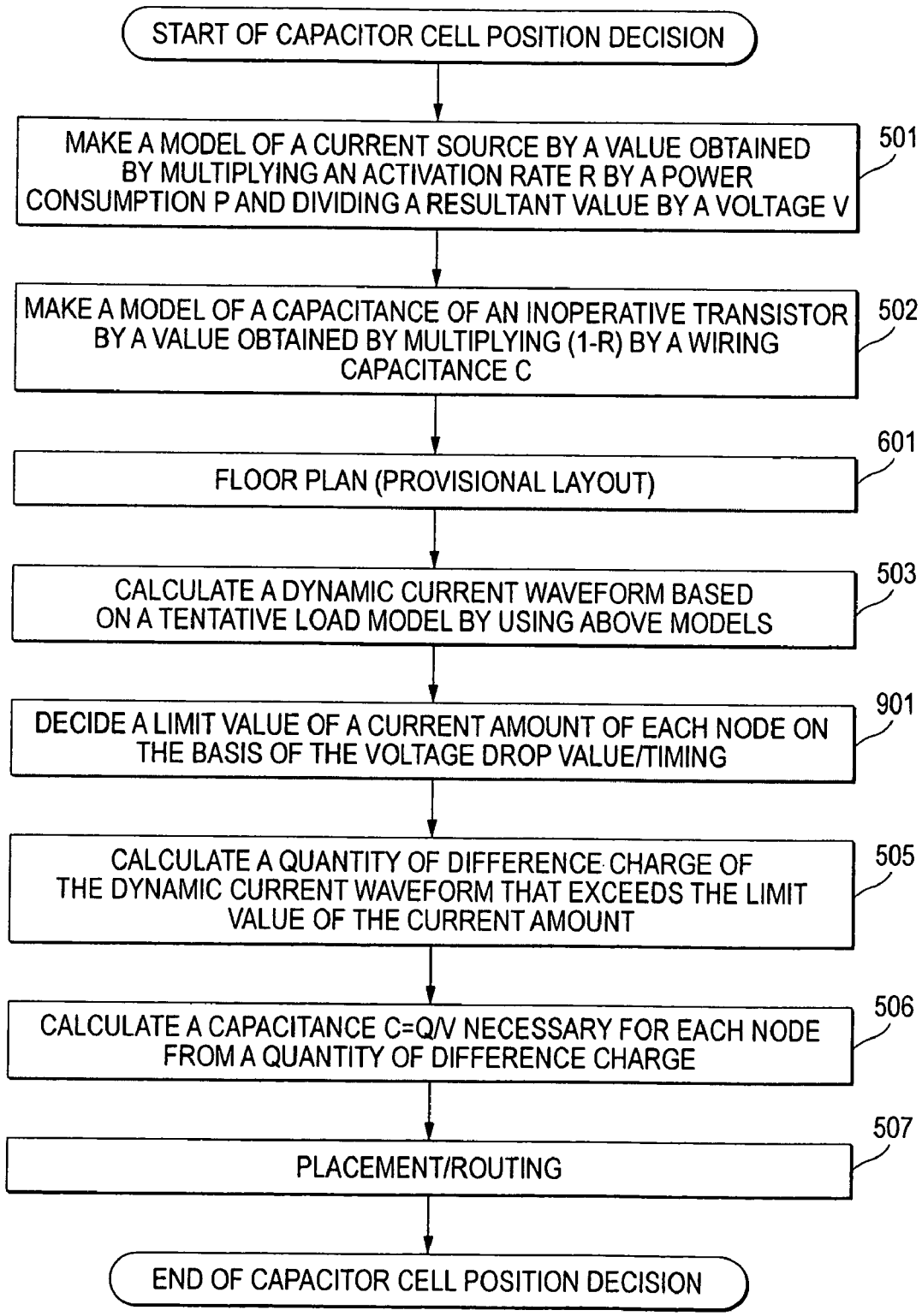
FIG. 10 is a flowchart inserting a timing information considering capacitance according to Embodiment 5 of the present invention.

Also, as shown in flowchart of FIG. 10, Embodiment 5 of the present invention is characterized in that a limit value of a current amount of each node is decided on the basis of the voltage drop value/timing.

The capacitor cell position deciding means 304 decides the limit value of the current amount of each node on the basis of the voltage drop value/timing in step 901. In this step where the weighting is decided on the basis of the timing (setup timing/hold timing restriction), simply the portion whose timing is severe in the common STA that does not consider the voltage drop is not aimed at. But the weighting is set heavily to the portion whose timing is severe when the STA is carried out by using the delay value that is decided by considering the voltage drop and whose timing is deteriorated mostly in contrast to the case where the voltage drop is not considered.

Also, in the case of the circuit in which an illegal timing is not generated even after the voltage drop is considered, it is desired that a variation in delay due to the voltage drop in the clock net should be suppressed by devising the measure to increase the weighting of the circuit portion in the clock system, or the link. Because of the addition of this step, the influence of the capacitive action of the inoperative transistor on the activation rate can be taken into consideration and also the heavy weighting is applied to the portion whose timing is severe. This makes it possible to insert the limited capacitances such that they can be used effectively to their maximum when the area is restricted.

Embodiment 6

Figure 11:
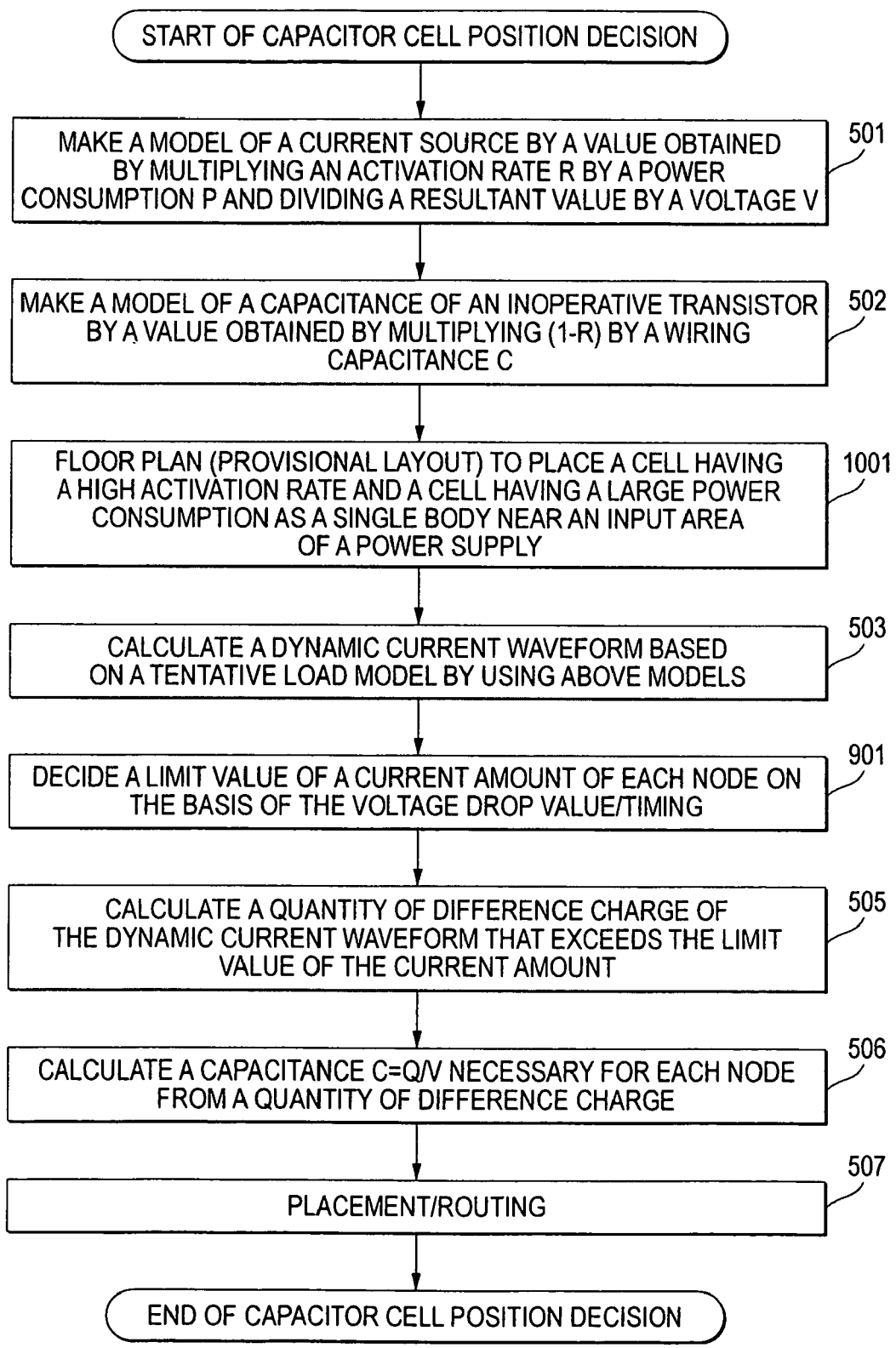
FIG. 11 is a flowchart controlling cell placement positions in a floor plan according to Embodiment 6 of the present invention.

Also, as shown in a flowchart of FIG. 11, Embodiment 6 of the present invention is characterized that a step 1001 in which the cell having the high activation rate and the cell having the large power consumption as a single body are placed near an input area of the power supply as closely as possible is added.

Like the flowchart shown in FIG. 11, the capacitor cell position deciding means 304 puts the cell having the high activation rate and the cell having the large power consumption as a single body as close as possible to the input area of the power supply at the time of floor plan (provisional layout) in step 1001. Because the cell having a relatively large power consumption is put close to the power supply pad from a center area of the LSI, the current flowing into the center area of the LSI can be reduced. Also, the necessary capacitance calculated in step 505 can be reduced. Because of addition of this step, the capacitance required in the center area of the LSI can be reduced and also an overall area of the LSI can be reduced.

Embodiment 7

Figure 12:
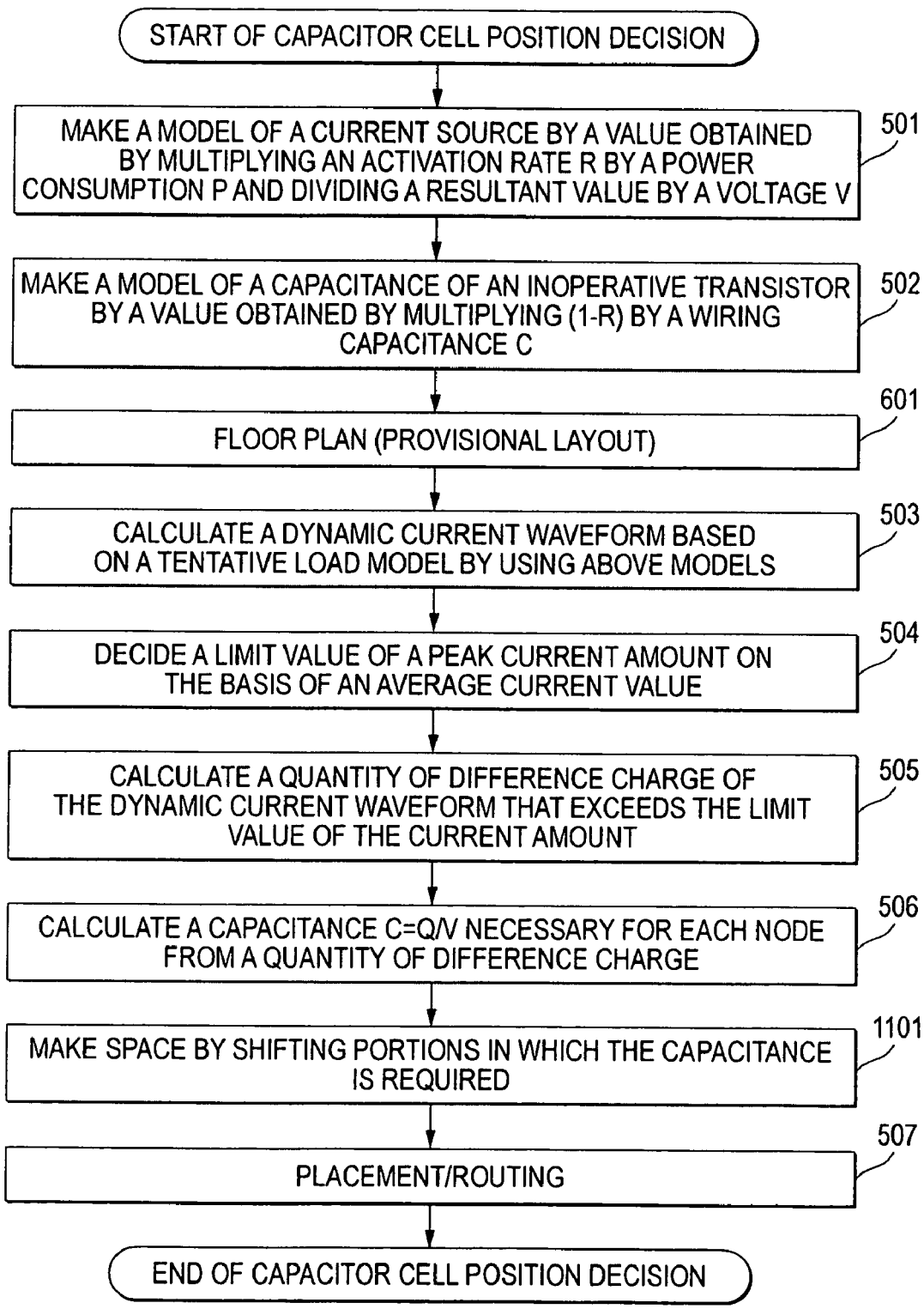
FIG. 12 is a flowchart ensuring a capacitor inserting area according to Embodiment 7 of the present invention.

Also, as shown in a flowchart of FIG. 12, Embodiment 7 of the present invention is characterized in that a step 1101 in which space is made by shifting portions in which the capacitance is required is contained.

Figure 13A:
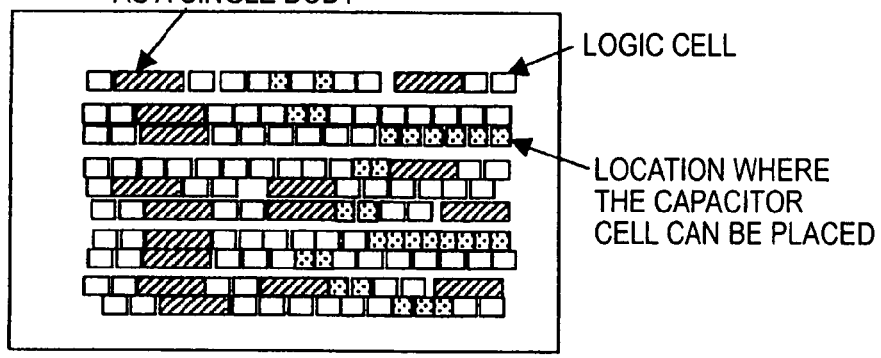
FIG. 13 is an image view ensuring a capacitor cell inserting position in Embodiment 7 of the present invention.
Figure 13B:
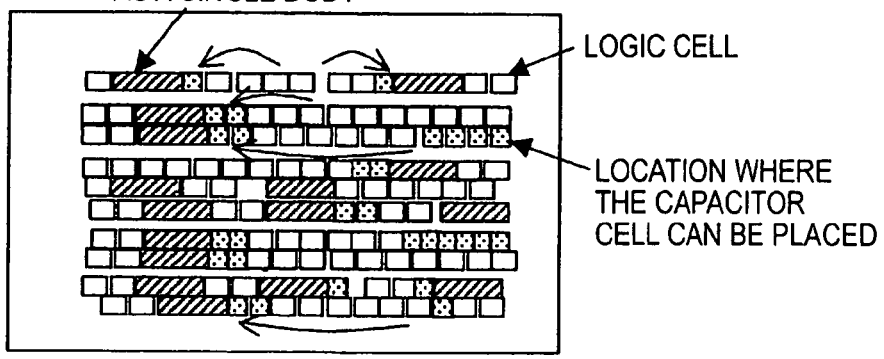

That is, as shown in FIG. 12, the capacitor cell position deciding means 304 makes the space by shifting the portions in which the capacitance is required in step 1101. In the case where the cells having the high activation rate and the cells having the large power consumption as a single body and the locations where the capacitor cell can be placed are present as shown in FIG. 13(a), positions of the logic cells are shifted based on the result of the process in step 1101 such that the location where the capacitor cell can be placed comes close to the cell having the large power consumption, as indicated with arrows in FIG. 13(b). Here, the number of cells that locate in the relevant area and need the sifting is calculated by calculating previously the locations and areas into which the capacitor cell should be inserted. Also, if the cells that are likely to have a severe timing owing to this shift are present, an increase of illegal timings can be suppressed by setting a relocation prohibiting flag to such cells, or the like. Hence, the capacitor cell can be placed in close vicinity of the location in which the capacitance is needed actually, and thus the resistance value between the capacitor and the supply destination can be suppressed low. As a result, the capacitance value required to supply the same current can be suppressed lower, and also a total area required to insert the capacitor can be suppressed.

Embodiment 8

Figure 14:
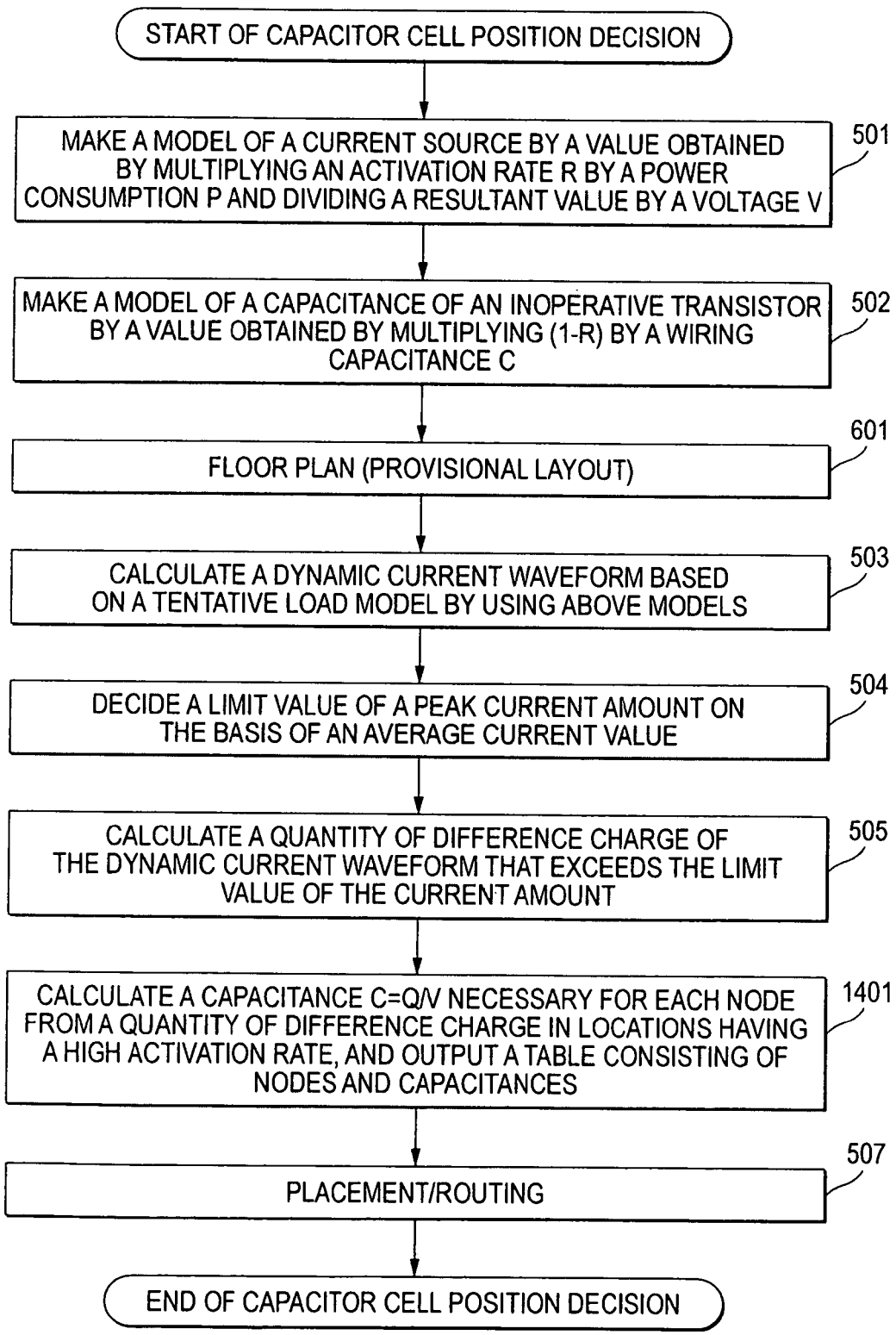
FIG. 14 is a flowchart showing an activation rate dependent weighting according to Embodiment 8 of the present invention.

Also, as shown in a flowchart of FIG. 14, Embodiment 8 of the present invention is characterized in that a step 1401 in which a capacitance C=Q/V necessary for each node is calculated from a quantity of difference charge in the locations having the high activation rate, and then output a table consisting of nodes and capacitances is added.

In this manner, in the present embodiment, since a step 1401 in which the capacitance C=Q/V necessary for each node is calculated from a quantity of difference charge in the locations having the high activation rate and then output the table consisting of nodes and capacitances is added to the operation steps of the capacitor cell position deciding means 304, the capacitor cell can be placed in the locations that have the high activation rate. This is effective for the high-speed operation.

Embodiment 9

Figure 15:
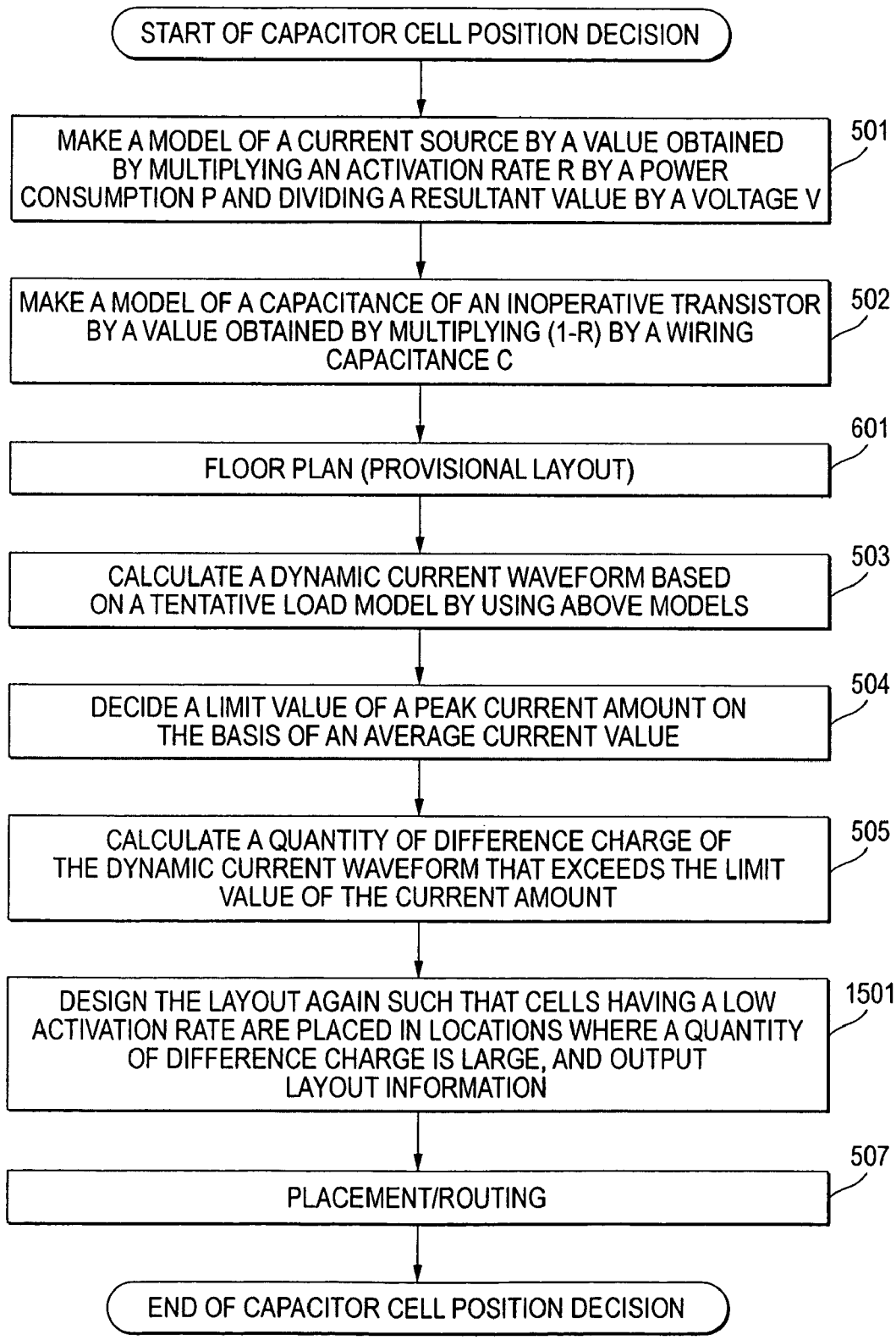
FIG. 15 is a flowchart controlling an activation rate dependent placement according to Embodiment 9 of the present invention.

Also, as shown in a flowchart of FIG. 15, Embodiment 9 of the present invention is characterized in that the layout is designed again such that the cells having the low activation rate are placed in locations where a quantity of difference charge is large, and then the locations that have the high activation rate and the locations that have the low activation rate are mixed by outputting layout information.

In the present embodiment, in step 1501, the capacitor cell position deciding means 304 senses the areas having a large quantity of difference charge and having a high density by analyzing a distribution of the quantity of difference charge, and then extracts the cell, whose operation timing derived from the STA information, or the like is different and whose activation rate is low, from neighboring cells. Then, the layout is designed once again such that the cells having the low activation rate are placed in locations where a quantity of difference charge is large, and then the locations that have the high activation rate and the locations that have the low activation rate can be mixed by outputting layout information. This is effective for the case where the placement of the capacitor cells is difficult.

Embodiment 10

Figure 16:
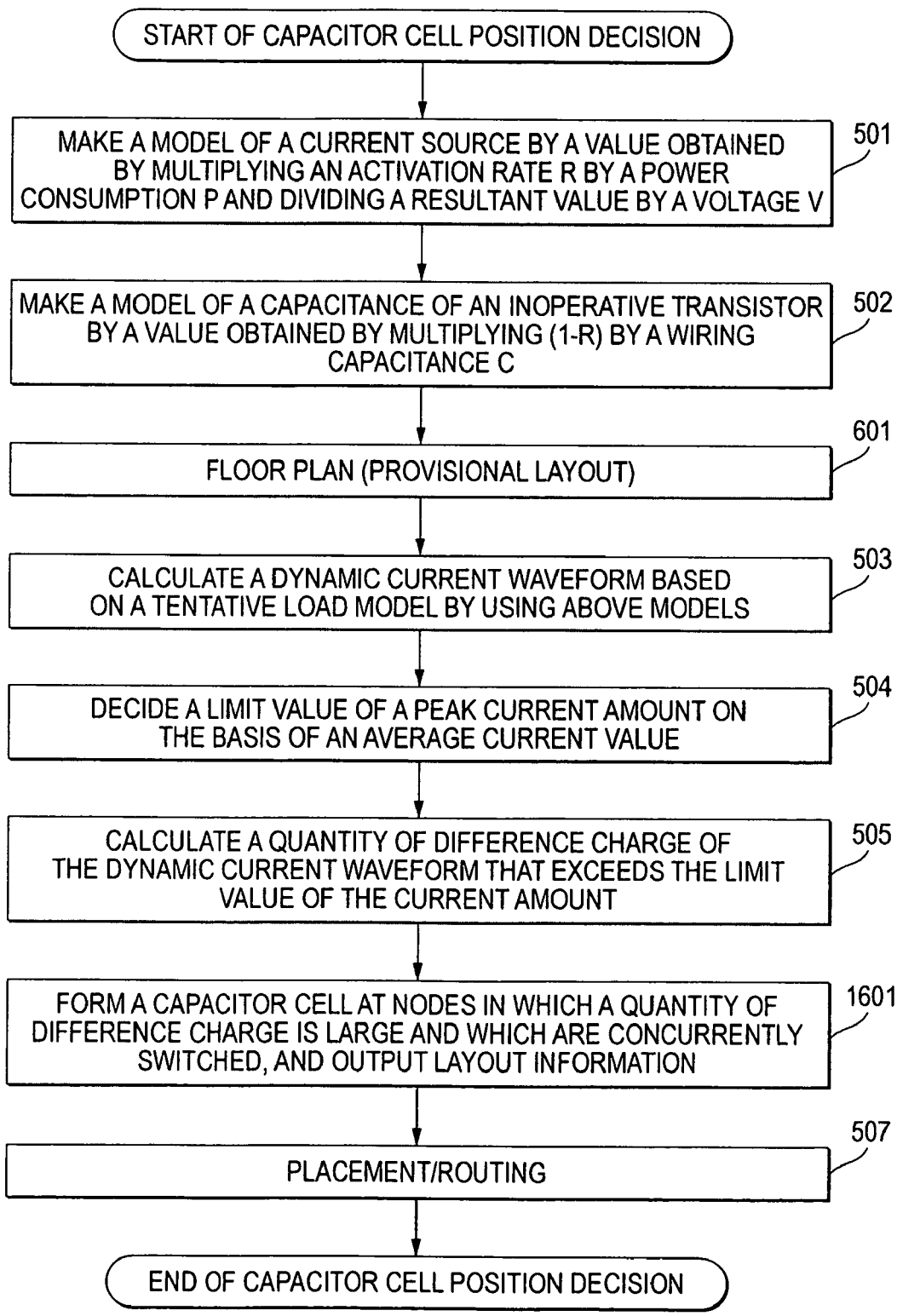
FIG. 16 is a flowchart showing an operating timing considering weighting according to Embodiment 10 of the present invention.

Also, as shown in a flowchart of FIG. 16, Embodiment 10 of the present invention is characterized in that a step 1601 in which the capacitor cell is formed at nodes in which a quantity of difference charge is large and which are concurrently switched, and then the layout information are output is added.

Figure 17:
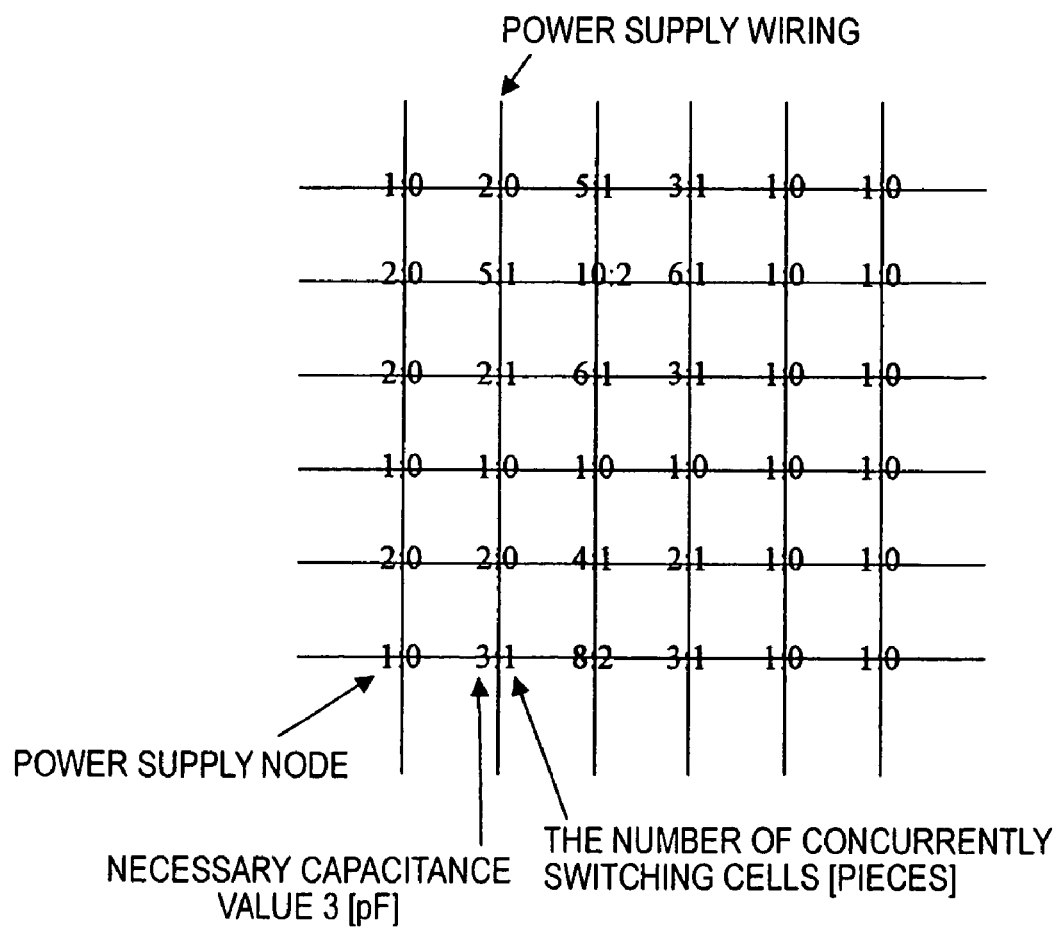
FIG. 17 is an image view showing the operating timing considering weighting in Embodiment 10 of the present invention.
Figure 18:
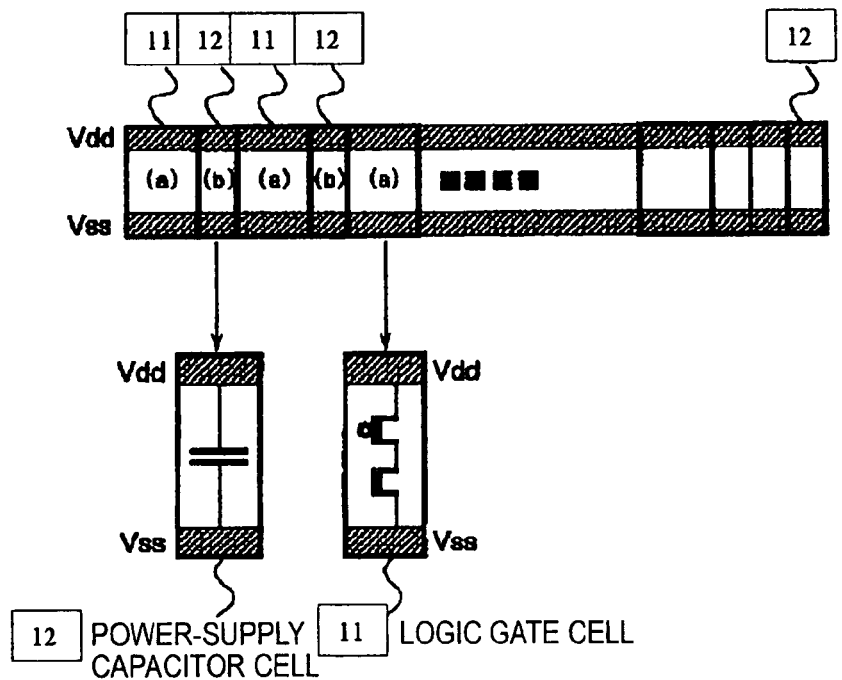
FIG. 18 is a view showing an example of a capacitor cell insertion in the prior art.
Figure 18:
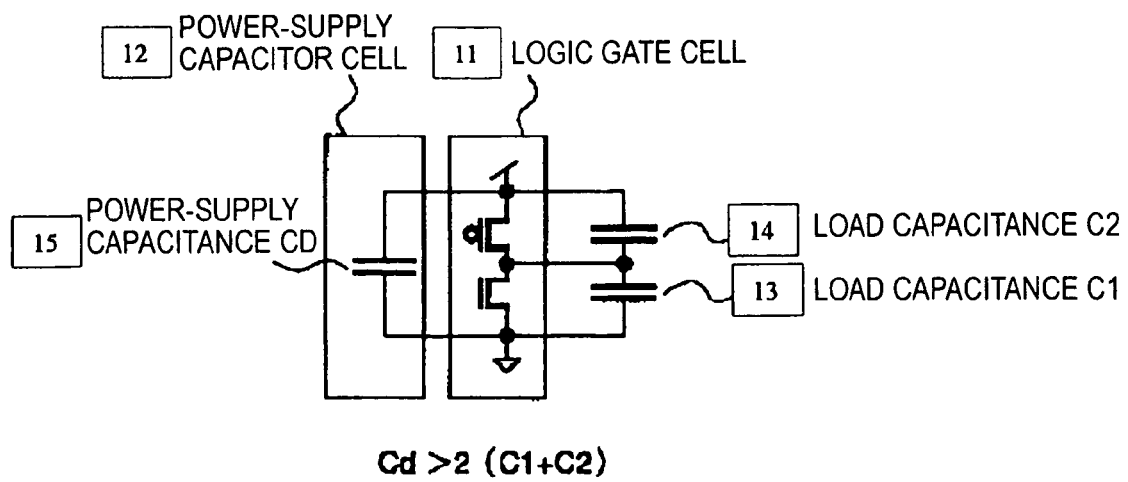

Also, like the flowchart shown in FIG. 16, in the capacitor cell position deciding means 304, the quantity of difference charge is analyzed along a time axis in addition to the area analysis on the real plane as step 1601, and then the analysis is applied to the nodes whose total quantity of difference charge is large at an identical time or neighboring times. Then, as shown in FIG. 17, table information corresponding to respective power supply nodes are generated. Here, only the power supply wirings are illustrated in FIG. 17, but actually the cells are present along the power supply wirings.

Then, the weighting is executed based on the number of concurrently switching cells and the necessary quantity of corresponding capacitance from the table generated in this way, and the capacitor cells are inserted.

In this way, an amount of current required particularly when neighboring cells are concurrently switched can be taken in consideration. Accordingly, the capacitor cells can be placed in the locations where the capacitor cell insertion effect is large, and thus the capacitor cells can be used effectively.

The designing method of the present invention can design the semiconductor integrated circuit capable of suppressing the power supply noise while taking account of a capacitive effect of transistors that are not being operated. Therefore, such designing method of the present invention can be utilized in designing various semiconductor integrated circuits.

What is claimed is:

1. A method of designing a semiconductor integrated circuit, comprising the steps of:

calculating a total capacitance required to optimize a voltage drop from circuit information, while considering whether or not respective cells in an object circuit are in an active status;

reading a maximum allowable current value of the semiconductor integrated circuit from net list information in the circuit information;

generating a load model from the net list information in the circuit information, and then calculating a cell operating time based on the load model;

calculating each cell power consumption based on the load model; and calculating dynamic power consumption information based on the cell operating time and the cell power consumption;

wherein the step of calculating the total capacitance includes:

converting the dynamic power consumption information into dynamic current information; and calculating a capacitance value required to restrain the dynamic current within the maximum allowable current value.

2. The method of designing a semiconductor integrated circuit, according to claim 1, wherein layout information is generated from the net list information, and then the load model is generated based on load information obtained from the layout information.

3. The method of designing a semiconductor integrated circuit, according to claim 1, wherein the step of calculating dynamic power consumption information is a step of calculating the dynamic power consumption information based on the cell operating time and the cell power consumption and the cell activation rate.

4. A method of designing a semiconductor integrated circuit, comprising the steps of:

calculating a total capacitance required to optimize a voltage drop from circuit information, while considering whether or not respective cells in an object circuit are in an active status;

executing a voltage drop analysis of the object circuit;

allotting a weight to power-supply capacitor insertable locations based on voltage drop values;

inserting a power-supply capacitance in order of weighting;

executing a timing calculation while considering the voltage drop values obtained in the step of executing the voltage drop analysis; and executing a weighting of the power-supply capacitor insertable locations, based on the voltage drop values and a result obtained in the step of executing the timing calculation.

5. The method of designing a semiconductor integrated circuit, according to claim 4, further comprising the steps of:

reading a cell activation rate from the circuit information;

wherein the step of executing the weighting is a step of allotting the weight to power-supply capacitor insertable locations, based on the voltage drop values and the cell activation rate.

6. A method of designing a semiconductor integrated circuit, comprising the steps of:

calculating a total capacitance required to optimize a voltage drop from circuit information, while considering whether or not respective cells in an object circuit are in an active status;

executing a voltage drop analysis of the object circuit;

allotting a weight to power-supply capacitor insertable locations based on voltage drop values;

inserting a power-supply capacitance in order of weighting;

calculating a cell operating time of each cell of the object circuit;

extracting a neighboring simultaneously operating cell of the object circuit; and extracting a location near which the extracted cell is placed;

wherein the step of inserting the power-supply capacitor inserts the power-supply capacitance preferentially into the extracted cell.

* * * * *